United States Patent
Kim et al.

(10) Patent No.: US 8,149,953 B2
(45) Date of Patent: Apr. 3, 2012

(54) DATA RECEIVER OF SEMICONDUCTOR INTEGRATED CIRCUIT

(75) Inventors: Hyung-Soo Kim, Ichon (KR); Kun-Woo Park, Ichon (KR); Yong-Ju Kim, Ichon (KR); Hee-Woong Song, Ichon (KR); Ic-Su Oh, Ichon (KR); Tae-Jin Hwang, Ichon (KR); Hae-Rang Choi, Ichon (KR); Ji-Wang Lee, Ichon (KR)

(73) Assignee: Hynix Semiconductor, Inc. (KR)

( * ) Notice: Subject to any disclaimer, the term of this patent is extended or adjusted under 35 U.S.C. 154(b) by 802 days.

(21) Appl. No.: 12/177,829

(22) Filed: Jul. 22, 2008

(65) Prior Publication Data

US 2009/0129459 A1    May 21, 2009

(30) Foreign Application Priority Data

Nov. 21, 2007   (KR) .................. 10-2007-0119152

(51) Int. Cl.
   *H03K 9/00*   (2006.01)
(52) U.S. Cl. ........ 375/316; 375/229; 375/230; 375/233; 375/326; 375/348; 375/355
(58) Field of Classification Search .................. 375/233, 375/316, 229, 230, 326, 347, 355
   See application file for complete search history.

(56) References Cited

U.S. PATENT DOCUMENTS

| | | | |
|---|---|---|---|
| 6,617,918 | B2 | 9/2003 | Casper |
| 7,233,173 | B1 | 6/2007 | Lewicki et al. |
| 7,701,257 | B2 * | 4/2010 | Bae ................................. 327/55 |
| 7,741,880 | B2 * | 6/2010 | Cha et al. ........................ 327/65 |

FOREIGN PATENT DOCUMENTS

| | | |
|---|---|---|
| JP | 2005-348021 | 12/2005 |
| JP | 2007-142811 | 6/2007 |
| KR | 1020030088322 A | 11/2003 |

OTHER PUBLICATIONS

Ramin Farjad-Rad, Chih-Kong Ken Yang, Mark A. Horowitz, and Thomas H. Lee, "A 0.3-um CMOS 8-Gb/s 4-PAM Serial Link Transceiver", IEEE Journal of Solid-State Circuits, May 2000, pp. 757-764, vol. 35, No. 5.

Vladimir Stojanovic, Andrew Ho, Bruno W. Garlepp, Fred Chen, Jason Wei, Grace Tsang, Elad Alon, Ravi T. Kollipara, Carl W. Werner, Jared L. Zerbe, and Mark A Horowitz, "Autonomous Dual-Mode (PAM2/4) Serial Link Transceiver With Adaptive Equalization and Data Recovery", IEEE Journal of Solid-State Circuits, Apr. 2005, pp. 1012-1026, vol. 40, No. 4.

* cited by examiner

*Primary Examiner* — Dhaval Patel
(74) *Attorney, Agent, or Firm* — Baker & McKenzie LLP

(57) ABSTRACT

A semiconductor integrated circuit equipped with an equalizer which has a circuit structure simpler than that of a related equalizer according to an FFE scheme or a DFE scheme and is capable of preventing a noise component from being amplified. The data receiver includes a plurality of receiver units, wherein each receiver unit includes a plurality of level detectors which detect different levels, and an encoder, in which the level detectors receive data according to a clock signal having a predetermined phase difference and perform an amplification operation including an equalization function based on feedback data, thereby outputting an amplification signal, and wherein level detectors of one receiver unit receive an amplification signal, as the feedback data, from level detectors of another receiver unit that receives a first clock signal having a phase more advanced than a phase of a second clock signal received in one receiver unit.

9 Claims, 9 Drawing Sheets

| Input Signal | high-level detector | mid-level detector | low-level detector |
|---|---|---|---|
| 00 | LOW | LOW | LOW |
| 01 | LOW | LOW | HIGH |
| 10 | LOW | HIGH | HIGH |
| 11 | HIGH | HIGH | HIGH |

(a)                        (b)

DATA RECEIVER OF SEMICONDUCTOR INTEGRATED CIRCUIT

CROSS-REFERENCES TO RELATED APPLICATION

The present application claims priority under 35 U.S.C. 119(a) to Korean application number 10-2007-0119152, filed on Nov. 21, 2007, which is incorporated by reference in its entirety as if set forth in full.

BACKGROUND

1. Technical Field

The embodiments described herein relate to a semiconductor integrated circuit, and, more particularly, to a data receiver of a semiconductor integrated circuit.

2. Related Art

As shown in FIG. 1, a conventional multi-level signaling data receiver of a semiconductor integrated circuit includes first to fourth receiver units 10 to 40. The first to fourth receiver units 10 to 40 detect and amplify multi-level differential data signals 'INP' and 'INN', which have been input through a pad PAD and a pad bar PADB, according to clock signals 'CLK000', 'CKL090', 'CLK180', and 'CLK 270' with a predetermined phase difference.

Since the first and fourth receiver units 10 to 40 have the same structure, the structure of the first receiver unit 10 will be representatively described below with respect to FIG. 2. As shown in FIG. 2, the first receiver unit 10 includes a high-level detector 11, a mid-level detector 12, and a low-level detector 13, which include their respective amplifiers and latches, and an encoder 14.

The high-level detector 11 outputs a high-level signal if the levels of the differential data 'INP' and 'INN' exceed a level of a first reference voltage HR. The mid-level detector 12 outputs a high-level signal if the levels of the differential data 'INP' and 'INN' exceed a level of a second reference voltage MR. The low-level detector 13 outputs a high-level signal if the levels of the differential data 'INP' and 'INN' exceed a level of a third reference voltage LR. The encoder 14 encodes output signals of the high-level detector 11, the mid-level detector 12, and the low-level detector 13.

As opposed to a conventional two level scheme for processing data using, i.e., '1' and '0', a multi-level signaling scheme processes data using four levels, i.e., '00', '01', '10', and '11'.

According to a conventional two level scheme for processing data, data is processed such that it has a level higher than or lower than a level of a specific reference voltage and then the data is transmitted. A receiver unit compares the level of the data with the level of the specific reference voltage to obtain the data of '1' or '0'.

Meanwhile, as shown in FIG. 3A, in a conventional multi-level signaling scheme, data is processed to such that it has a level belonging to one of four-step sections, which are obtained based on the first to third reference voltages HR, MR, and LR, and then the data is transmitted. As shown in FIG. 3B, a receiver unit, or more specifically the high-level detector 11, the mid-level detector 12, and the low-level detector 13 of the first to fourth receiver units 10 to 40 output high-level signals or low-level signals through the comparison with the first to third reference voltages HR, MR, and LR, and obtain data of '00', '01', '10', or '11' by encoding the output signals in the encoder 14.

As the data rate of conventional semiconductor integrated circuits gradually increases, the design margin for a conventional data receiver is gradually decreasing. One of the main factors leading to the decrease in design margin is "inter symbol interference". The inter symbol interference can occur because signal loss increases as the frequency of data transmission increases.

When a multi-level signaling scheme is used the signal loss can be even worse, since a low voltage level is divided into several sections. Thus, the design margin of the data receiver is even worse due to inter symbol interference.

Accordingly, a multi-level data receiver additionally requires an equalizer to compensate for the signal loss.

A feed-forward equalization (FFE) scheme and a decision-feedback equalization (DFE) scheme can be used as representative schemes for constructing the equalizer. Example, FFE and the DFE schemes are seen in "IEEE JSSC, Vol.35, No.5., May 2000, pp.757-764" and "IEEE JSSC, Vol. 40, No. 4., April 2005, pp.1012-1026, respectively. However, when a FFE or DFE scheme is used, the circuit structure can become very complex. Moreover, a FFE scheme can amplify noise as well as the data, adding to the problems.

SUMMARY

A data receiver of a semiconductor integrated circuit equipped with an equalizer that has a circuit structure simpler than that of a related equalizer according to an FFE scheme or a DFE scheme and is capable of preventing a noise component of a data signal from being amplified is described herein.

In one aspect, a data receiver of a semiconductor integrated circuit includes a plurality of receiver units, wherein each receiver unit includes a plurality of level detectors configured to detect different signal levels, and an encoder, the level detectors configured to receive data according to a clock signal having a predetermined phase difference and to perform an amplification operation including an equalization function based on feedback data, thereby outputting an amplification signal, and wherein level detectors of one receiver unit receive an amplification signal, as the feedback data, from level detectors of another receiver unit that receives a first clock signal having a phase more advanced than a phase of a second clock received in one receiver unit.

These and other features, aspects, and embodiments are described below in the section entitled "Detailed Description."

BRIEF DESCRIPTION OF THE DRAWINGS

The above and other aspects, features and other advantages of the subject matter of the present disclosure will be more clearly understood from the following detailed description taken in conjunction with the accompanying drawings, in which.

DETAILED DESCRIPTION

Figure 4:
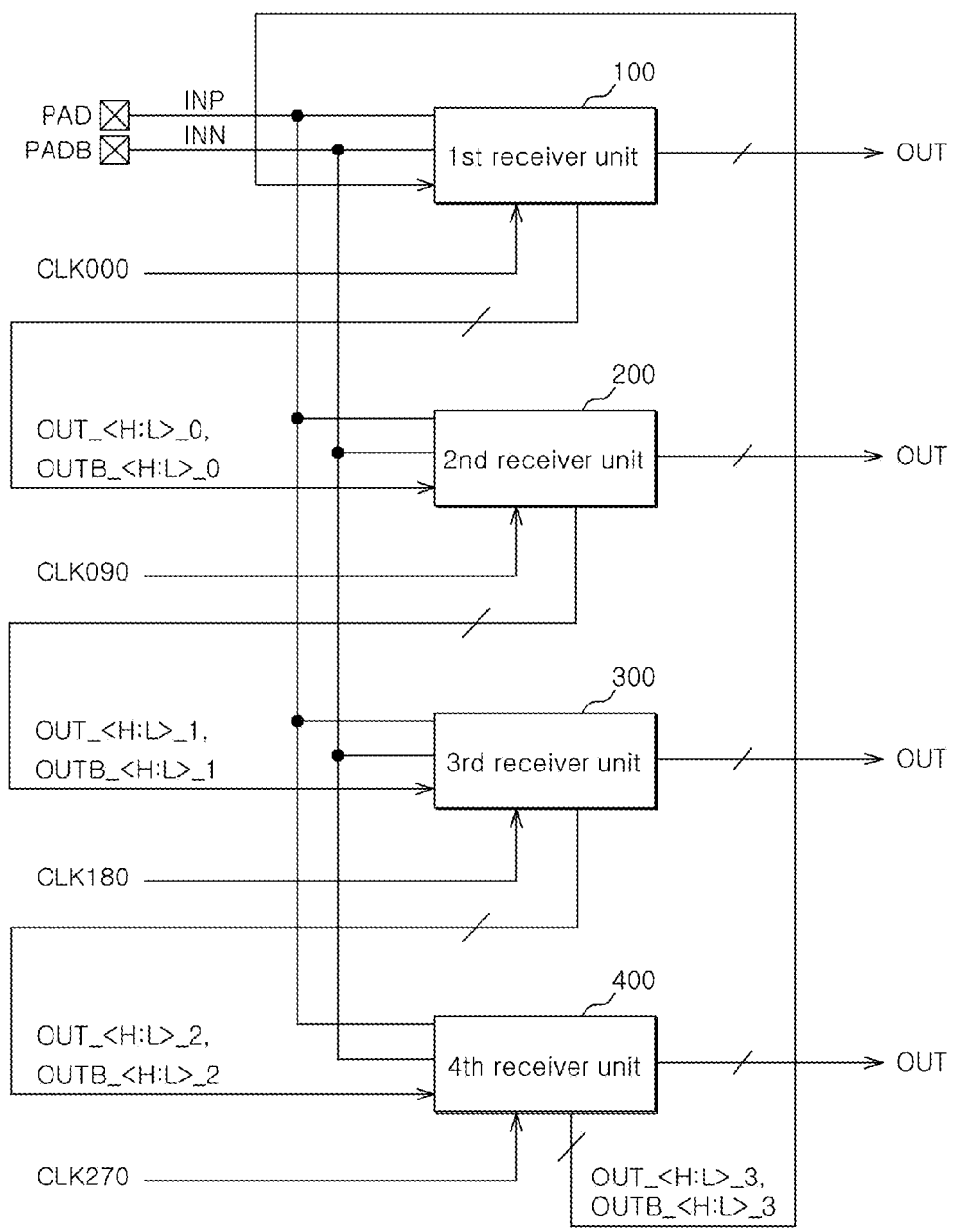
FIG. 4 is a block diagram showing a data receiver of a semiconductor integrated circuit according to one embodiment.

A data receiver of a semiconductor integrated circuit according to the embodiments described herein can include a plurality of receiver units operating according to a multiple-phase clock signal. In detail, as shown in FIG. 4, a data receiver according to one embodiment includes first to fourth receiver units 100 to 400 that receive, detect, and amplify differential data signals 'INP' and 'INN' according to first to fourth clock signals 'CLK000' to 'CLK270' each comprising a different phase. Hereinafter, amplification signals 'OUT_<H>', 'OUT_<M>', and 'OUT_<L>' will be simply referred to as an amplification signal 'OUT_<H:L>'.

The first receiver unit 100 can receive the differential data signals 'INP' and 'INN' through a pad PAD and a pad bar PADB. The first receiver unit 100 can receive the first clock signal 'CLK000' to output first amplification signals 'OUT_<H:L>_0' and 'OUTB_<H:L>_0' to the second receiver unit 200 as feedback data. The first receiver unit 100 can receive fourth amplification signals 'OUT_<H:L>_3' and 'OUTB_<H:L>_3' as feedback data.

The second receiver unit 200 can receive the differential data signal 'INP' and 'INN' through the pad PAD and the pad bar PADB. The second receiver unit 200 can receive the second clock signal 'CLK090' to output second amplification signals 'OUT_<H:L>_1' and 'OUTB_<H:L>_1' to the third receiver unit 300 as feedback data. The second receiver unit 200 can receive the first amplification signals 'OUT_<H:L>_0' and 'OUTB_<H:L>_0' as feedback data.

The third receiver unit 300 can receive the differential data signals 'INP' and 'INN' through the pad PAD and the pad bar PADB. The third receiver unit 300 can receive the third clock signal 'CLK180' to output third amplification signals 'OUT_<H:L>_2' and 'OUT_<H:L>_2' to the fourth receiver unit 400 as feedback data. The third receiver unit 300 can receive the second amplification signals 'OUT_<H:L>_1' and 'OUTB_<H:L>_1' as feedback data.

The fourth receiver unit 400 can receive the differential data signal 'INP' and 'INN' through the pad PAD and the pad bar PADB. The fourth receiver unit 400 can receive the fourth clock signal 'CLK270' to output fourth amplification signals 'OUT_<H:L>_3' and 'OUT_<H:L>_3' to the first receiver unit 100 as feedback data. The fourth receiver unit 400 can receive the third amplification signals 'OUT_<H:L>_2' and 'OUTB_<H:L>_2' as feedback data.

Figure 5:
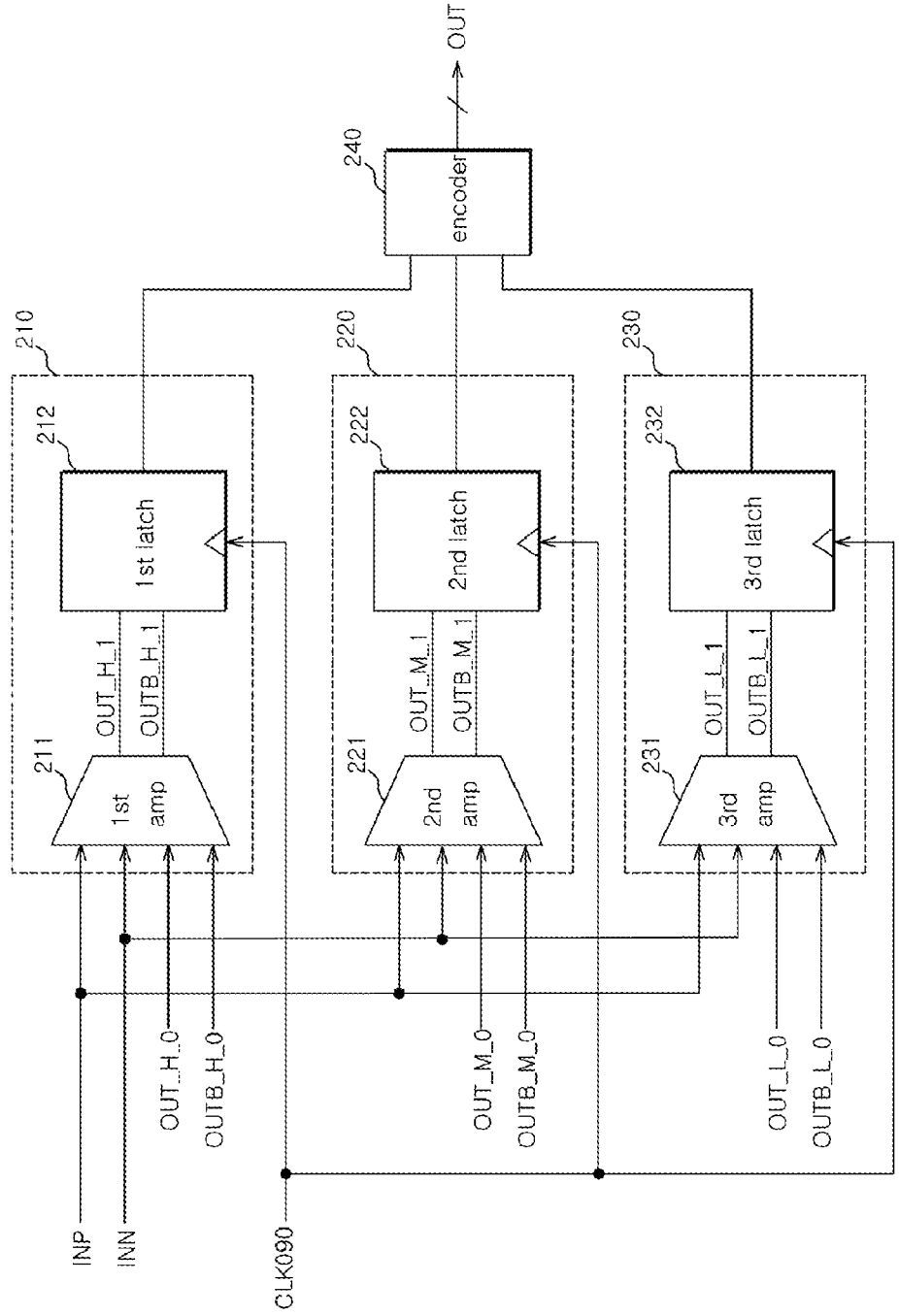
FIG.5 is a block diagram showing a second receiver unit that can be included in the data receiver of FIG. 4.

Since the first to fourth receiver units 100 to 400 can have the same structure, the structure of the second receiver unit 200 will be representatively described with reference to FIG. 5. As can be seen, the second receiver unit 200 can include a high-level detector 210, a mid-level detector 220, a low-level detector 230, and an encoder 240.

The high-level detector 210, the mid-level detector 220, and the low-level detector 230 can be configured to perform an equalization function by adjusting offsets of first to third reference voltage HR, MR, and LR (see FIGS. 3A and 3B) used to detect the differential data signals 'INP' and 'INN' using the feedback data.

Figure 1:
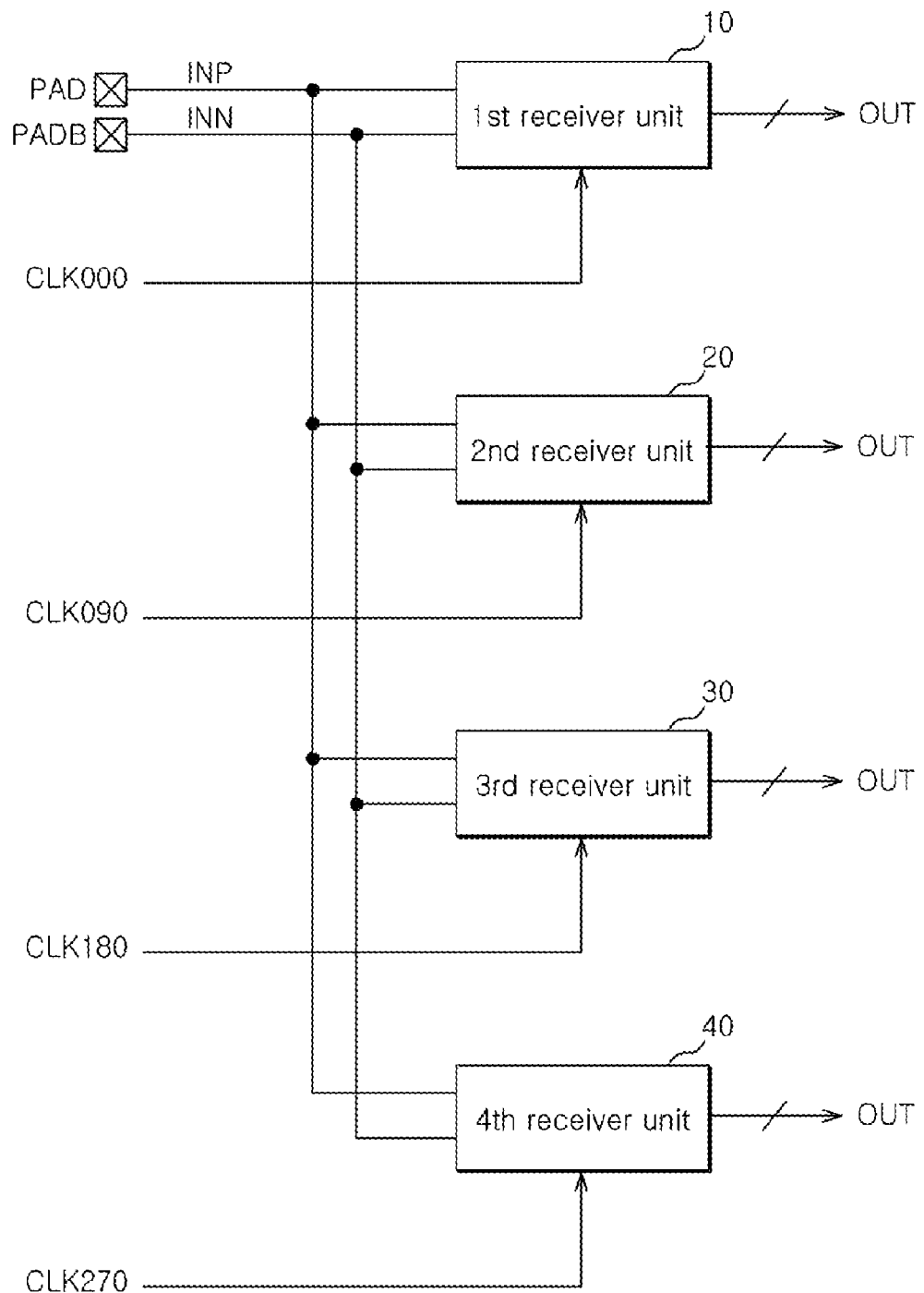
FIG. 1 is a block diagram showing a conventional data receiver of a semiconductor integrated circuit.
Figure 2:
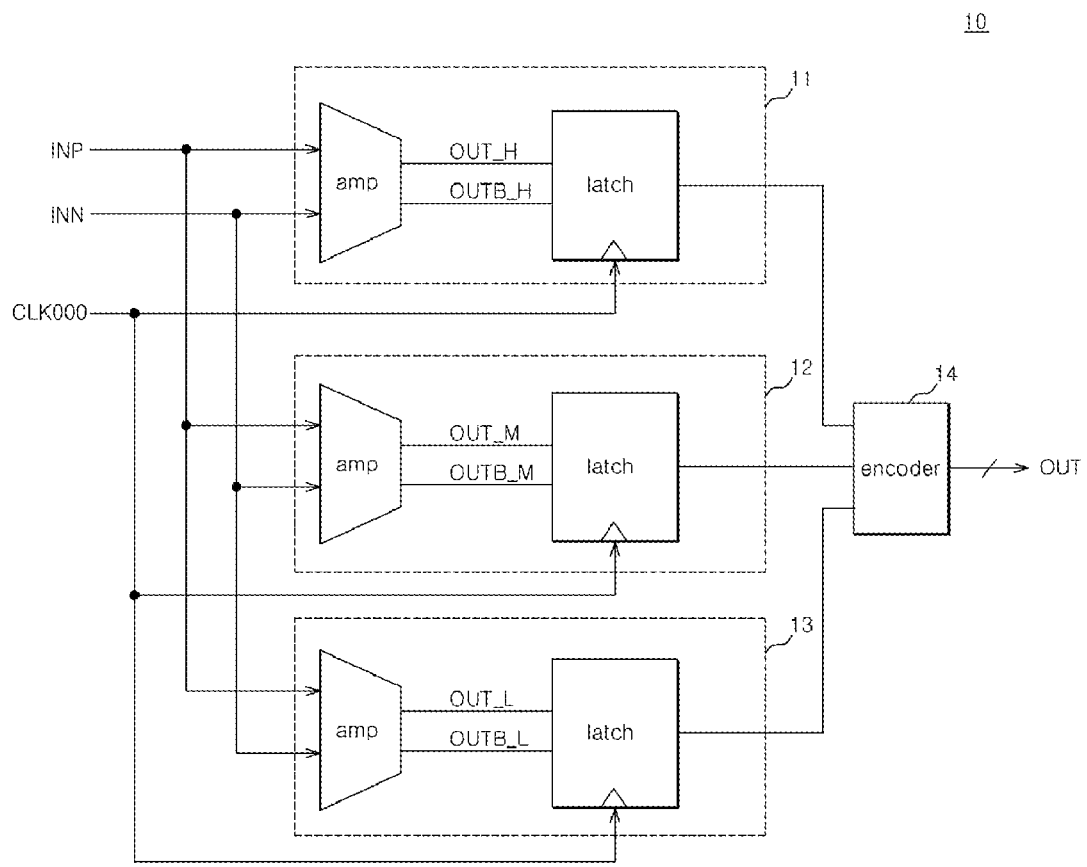
FIG. 2 is a block diagram of a first receiver unit that can be included in the data receiver of FIG. 1.
Figure 3:
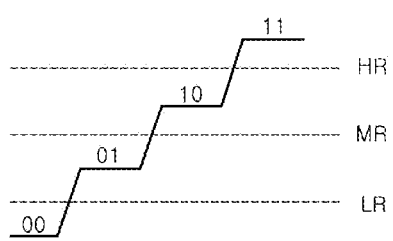
FIG. 3A is a waveform diagram illustrating the operation of a multi-level signaling scheme.
FIG. 3B is a table further illustrating the multi-level signaling.

The encoder 240 can be configured to encode output signals of the high-level detector 210, the mid-level detector 220, and the low-level detector 230 as shown in a table of FIG. 3B to output a 2-bit signal.

The high-level detector 210 can include a first amplifier 211 and a first latch 212. The first amplifier 211 can receive the first amplification signals 'OUT_H_0' and 'OUTB_H_0' output from a first amplifier of the first receiver unit 100 as feedback data to amplify the differential data signals 'INP' and 'INN' according to the first reference voltage MR having an adjusted offset, thereby outputting the second amplification signals 'OUT_H_1' and 'OUT_H_1'.

The mid-level detector 220 can include a second amplifier 221 and a second latch 212. The second amplifier 221 can be configured to receive the first amplification signals 'OUT_M_0' and 'OUTB_M_0' output from a second amplifier of the first receiver unit 100 as feedback data to amplify the differential data signals 'INP' and 'INN' according to the second reference voltage MR having an adjusted offset, thereby outputting the second amplification signals 'OUT_M_1' and 'OUT_M_1'.

The low-level detector 230 can include a third amplifier 231 and a third latch 232. The third amplifier 231 can receive the first amplification signals 'OUT_L_0' and 'OUTB_L_0' output from a third amplifier of the first receiver unit 100 as feedback data to amplify the differential data signals 'INP' and 'INN' according to the third reference voltage LR having an adjusted offset, thereby outputting the second amplification signals 'OUT_L_1' and 'OUT_L_1'.

Figure 6:
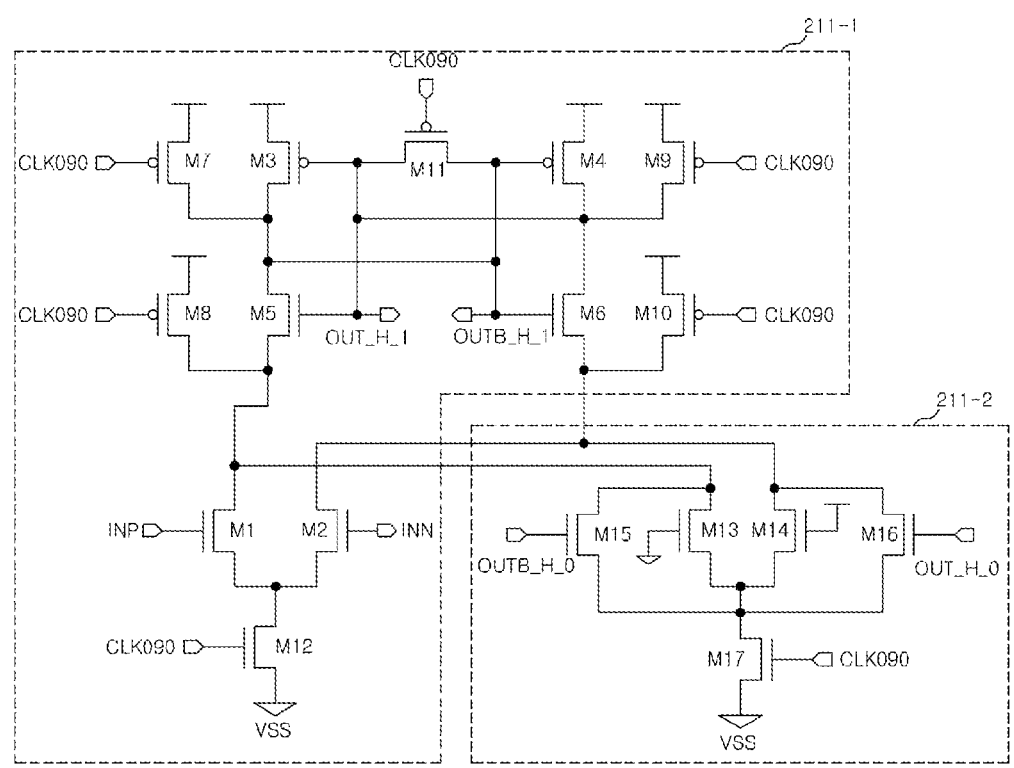
FIG. 6 is a circuit diagram showing a first amplifier that can be included in the second receiver unit of FIG. 5.

The first amplifier 211 can include a cross coupled latch circuit 211-1 and an adjustment circuit 211-2 as shown in FIG. 6.

The cross coupled latch circuit 211-1 can include first to twelfth transistors M1 to M12. The differential data signals 'INP' and 'INN' can be input to gates of the first and second transistors M1 and M2. The seventh to twelfth transistors M7 and M12 can be configured to stop the operation of the first amplifier 211 and precharge output terminals of the second amplification signals 'OUT_H_1' and 'OUTB_H_1' with a high level when the second clock signal 'CLK090' is inactive.

The adjustment circuit 211-2 can be configured to adjust the signal levels at the output terminals of the first and second transistors M1 and M2 of the cross coupled latch circuit 211-1 to set the first reference voltage HR, and adjust the offset of the first reference voltage HR by varying turn-on levels of the first and second transistors M1 and M2 according to the first amplification signals 'OUT_H_0' and 'OUTB_H_0'.

The adjustment circuit 211-2 can include thirteenth to seventeenth transistors M13 to M17. The thirteenth transistor M13 can include a gate connected to a terminal of a grounding voltage and a drain connected to a drain of the first transistor M1 of the cross coupled latch circuit 211-1. The fourteenth transistor M14 can include a gate connected to a terminal of a power supply voltage and a drain connected to a drain of the second transistor M2 of the cross coupled latch circuit 211-1. The fifteenth transistor M15 can include a gate receiving the first amplification signal 'OUTB_H_0' and a drain connected to the drain of the first transistor M1 of the cross coupled latch circuit 211-1. The sixteenth transistor M16 can include a gate receiving the first amplification signal 'OUT_H_0' and a drain connected to the drain of the second transistor M2 of the cross coupled latch circuit 211-1. The seventeenth transistor M17 can include a gate receiving the second clock signal 'CKL090', a source connected to the terminal of the grounding voltage, and a drain commonly connected to sources of the thirteenth to the sixteenth transistors M13 to M16.

Figure 7:
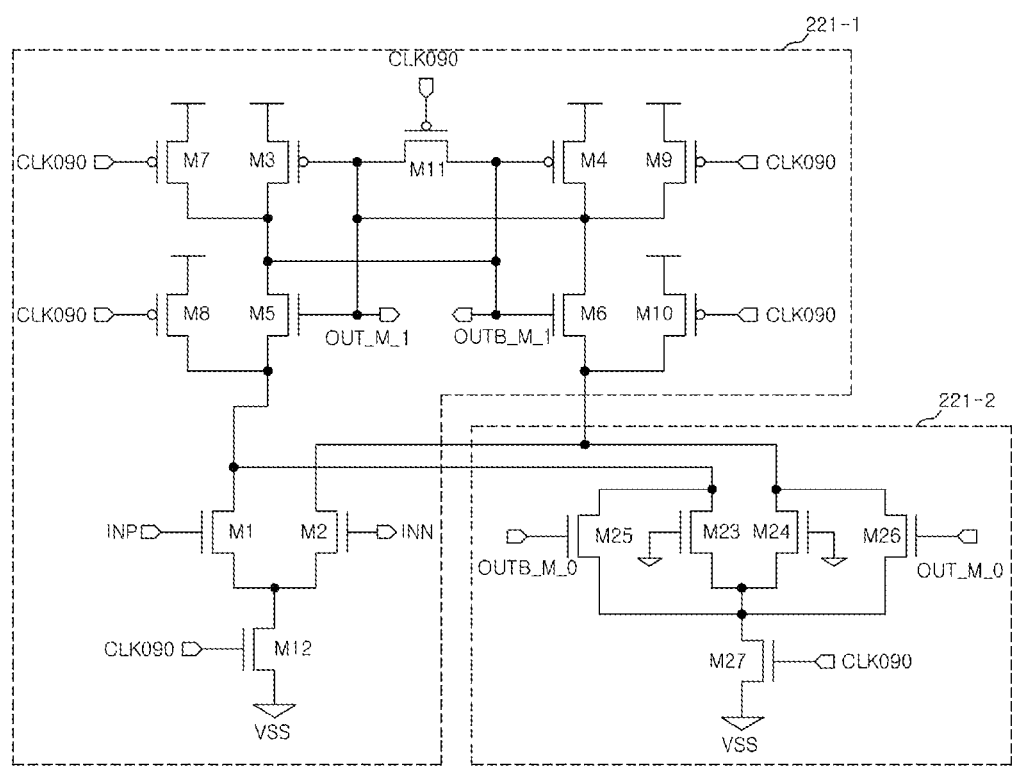
FIG. 7 is a circuit diagram showing a second amplifier that can be included in the data receiver of FIG. 5.

The second amplifier 221 can include a cross coupled latch circuit 221-1 and an adjustment circuit 221-2 as shown in FIG. 7. The cross coupled latch circuit 221-1 can have the same structure as that of the cross coupled latch circuit 211-1 of the first amplifier 211.

The adjustment circuit 221-2 can be configured to adjust the signal levels on the output terminals of the first and second transistors M1 and M2 of the cross coupled latch circuit 221-1 to set the second reference voltage MR, and adjust the offset of the second reference voltage MR by varying turn-on levels of the first and second transistors M1 and M2 according to the first amplification signals 'OUT_M_0' and 'OUTB_M_0'.

The adjustment circuit 221-2 can include thirteenth to seventeenth transistors M23 to M27. The thirteenth transistor M23 can include a gate connected to a terminal of a grounding voltage and a drain connected to a drain of the first transistor M1 of the cross coupled latch circuit 221-1. The fourteenth transistor M24 can include a gate connected to the terminal of the grounding voltage and a drain connected to a drain of the second transistor M2 of the cross coupled latch circuit 221-1. The fifteenth transistor M25 can include a gate receiving the first amplification signal 'OUTB_M_0' and a drain connected to the drain of the first transistor M1 of the cross coupled latch circuit 221-1. The sixteenth transistor M26 can include a gate receiving the first amplification signal 'OUT_M_0' and a drain connected to the drain of the second transistor M2 of the cross coupled latch circuit 221-1. The seventeenth transistor M27 can include a gate receiving the second clock signal 'CKL090', a source connected to the terminal of the grounding voltage, and a drain commonly connected to sources of the thirteenth to the sixteenth transistors M23 to M26.

Figure 8:
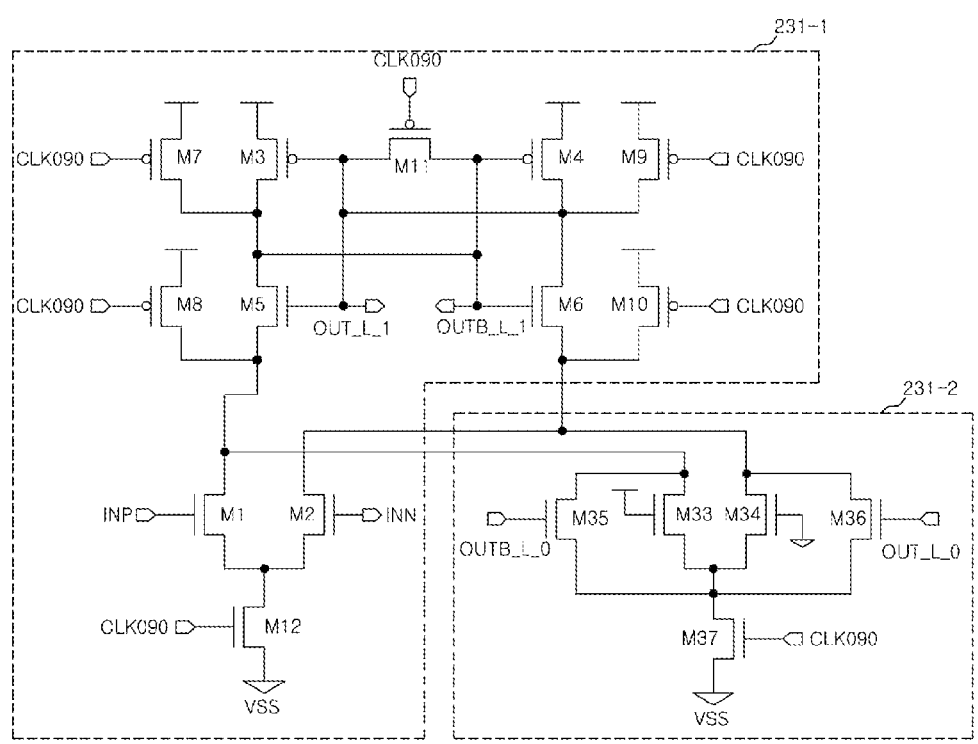
FIG. 8 is a circuit diagram showing a third amplifier that can be included in the data receiver of FIG. 5.

The third amplifier 231 can include a cross coupled latch circuit 231-1 and an adjustment circuit 231-2 as shown in FIG. 8. The cross coupled latch circuit 231-1 can have the same structure as that of the cross coupled latch circuit 211-1 of the first amplifier 211.

The adjustment circuit 231-2 can be configured to adjust levels of output terminals of the first and second transistors M1 and M2 of the cross coupled latch circuit 231-1 to set the third reference voltage LR, and adjusts the offset of the third reference voltage LR by varying turn-on levels of the first and second transistors M1 and M2 according to the first amplification signals 'OUT_L_0' and 'OUTB_L_0'.

The adjustment circuit 231-2 can include thirteenth M33 to seventeenth transistors M37. The thirteenth transistor M33 can include a gate connected to a terminal of a power supply voltage and a drain connected to a drain of the first transistor M1 of the cross coupled latch circuit 231-1. The fourteenth transistor M34 can include a gate connected to a terminal of a grounding voltage and a drain connected to a drain of the second transistor M2 of the cross coupled latch circuit 231-1. The fifteenth transistor M35 can include a gate receiving the first amplification signal 'OUTB_L_0' and a drain connected to the drain of the first transistor M1 of the cross coupled latch circuit 231-1. The sixteenth transistor M36 can include a gate receiving the first amplification signal 'OUT_L_0' and a drain connected to the drain of the second transistor M2 of the cross coupled latch circuit 231-1. The seventeenth transistor M37 can include a gate receiving the second clock signal 'CKL090', a source connected to the terminal of the grounding voltage, and a drain commonly connected to sources of the thirteenth to the sixteenth transistors M33 to M36.

Hereinafter, the operation of data receiver 101 will be described. Since the first to fourth receiver units 100 to 400 have the same structure, the operation of the second receiver unit 200 will be representatively described. In particular, the equalization function performed by second receiver unit 200 will be described. The equalization function is a scheme in which an amplifier determines if its feedback data level exceeds a reference voltage level predetermined for the amplifier and then adjusts the offset of the reference voltage level, thereby improving the detection accuracy and the detection speed for present data. In other words, the first amplifier 211 raises a level of the first reference voltage HR if the level of the first amplification signal 'OUT_H_0' and 'OUTB_H_0' exceeds the level of the first reference voltage HR; otherwise, the first amplifier 211 lowers the level of the first reference voltage HR. The second amplifier 221 raises a level of the second reference voltage MR if levels of the first amplification signals 'OUT_M_0' and 'OUTB_M_0' exceed the level of the second reference voltage MR; otherwise, the second amplifier 221 lowers the level of the second reference voltage MR. The third amplifier 221 raises a level of the third reference voltage LR if levels of the first amplification signals 'OUT_L_0' and 'OUTB_L_0' exceed a level of the third reference voltage LR; otherwise, the third amplifier 221 lowers the level of the third reference voltage LR. In such a manner, the equalization function is performed.

The offsets of the reference voltage levels are adjusted by controlling the turn-on levels of the transistors M1 and M2, which receive the differential data signals 'INP' and 'INN', through the adjustment circuits 211-2, 221-2, and 231-2 provided in the first to third amplifiers 211 to 231, respectively.

Amplification signals generated according to the differential data signals 'INP' are 'OUT_H_<0:3>', 'OUT_M_<0:3>', and 'OUT_H_<0:3>', and 'OUTB_H_<0:3>', 'OUTB_M_<0:3>', and 'OUTB_H_<0:3>'.

The first to third amplifiers 211, 221, and 231 can have circuits in which the fifteenth transistors M15, M25, and M35 connected to the first transistor M1 receiving the differential data signal 'INP', and can receive the amplification signals 'OUTB_H_0', 'OUTB_M_0', and 'OUTB_L_0' generated according to the differential data signal 'INN', respectively, and the sixteenth transistors M16, M26, and M36 connected to the second transistor M2 receiving the differential data signal 'INN', and can receive the amplification signals 'OUT_H_0', 'OUT_M_0', and 'OUT_L_0' generated according to the differential data signal 'INP'. Accordingly, the first to third amplifiers 211, 221, and 231 can adjust the turn-on levels of the transistors M1 and M2 such that the first to third reference voltages HR, MR, and LR are raised or lowered according to the first amplification signals 'OUT_<H:L>_0' and 'OUTB_<H:L>_0'.

Figure 9:
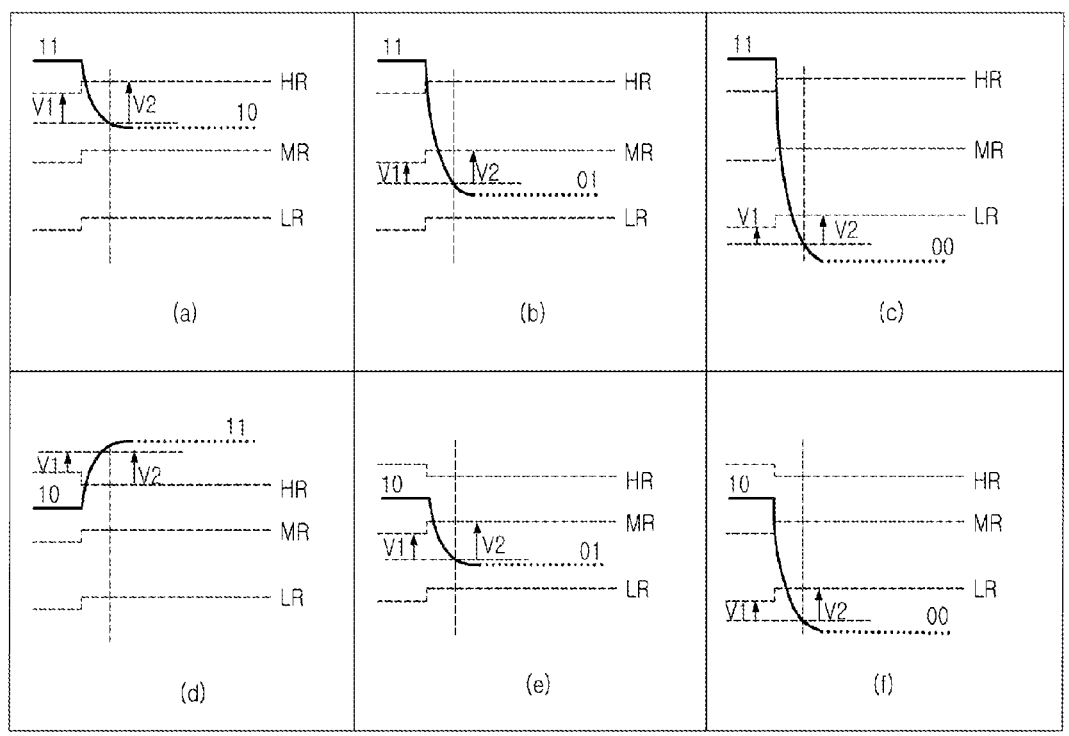
FIGS. 9A to 9F illustrate waveforms used to explain the principle of an equalization function performed by the data receiver of FIG. 4.

FIGS. 9A to 9F are graphs used to explain the equalization function. FIGS. 9A to 9C are graphs illustrating a case in which previous data '11' is changed into present data '10', '01', or '00'.

In this case, the '11' is higher than levels of all the first to third reference voltages HR, MR, and LR. The first to third amplifiers 211 to 231 having received the first amplification signals 'OUT_<H:L>_0' and 'OUTB_<H:L>_0', as feedback data, which are obtained by amplifying the '11', raise the levels of all the first to third reference voltages HR, MR, and LR. The first to third amplifiers 211 to 231 detect and amplify present data suitably for the adjusted first to third reference voltages HR, MR, and LR. In this case, since the first to third amplifiers 211 to 231 detect data, the level of which is transited from '11' into '10', '01', or '00', by raising the levels of the first to third reference voltage HR, MR, and LR by a level of V2-V1, the data detection speed and a data detection accuracy are improved.

FIGS. 9D to 9F are graphs illustrating a case in which previous data '10' are transited into present data '11', '01', or '00'.

In this case, the level of '10' is lower than the first reference voltage HR, and higher than the second and third reference voltages MR and LR. The first amplifier 211 having received the first amplification signals 'OUT_H_0' and 'OUTB_H_0', which is obtained by amplifying the '10', as feedback data lowers the level of the first reference voltage HR. The second and third amplifiers 221 and 231 having received the first amplification signals 'OUT_<M:L>_0' and 'OUTB_<M:L>_0', which are obtained by amplifying the '10', raise the second and third reference voltages MR and LR. The first to third amplifiers 211 to 231 detect and amplify the present data suitably for the first to third reference voltages HR, MR, and LR. As shown in FIG. 9D, since data having a level transited from '10' into '11' are detected by lowering the level of the first reference voltage HR by a level of V2-V1, a data detection speed and data detection accuracy can be improved. As shown in FIGS. 9E to 9F, since data having a level shifted from '10' into '01' or '00' are detected by raising the levels of the second and third reference voltages MR and LR by a level of V2-V1, a data detection speed and data detection accuracy can be improved.

If data are detected and amplified at the rising edge of a clock signal in the characteristic of an amplifier, then present output is maintained even if the offset in a circuit of the amplifier is changed. Accordingly, even if an output value is precharged with a high level due to the deactivation of the clock signal, the output of the amplifier having received feedback data generated according to precharge duration is not changed. In other words, according to the equalization function as described herein, the offset of a reference voltage is corrected according to feedback data. In this case, since the feedback data generated according to precharge duration does not affect the equalization function, the amplifier can stably operate. In addition, since a signal amplified to a CMOS level is employed as the feedback data, it is possible to prevent noise in a signal line from being amplified.

While certain embodiments have been described above, it will be understood that the embodiments described are by way of example only. Accordingly, the apparatus and methods described herein should not be limited based on the described embodiments. Rather, the apparatus and methods described herein should only be limited in light of the claims that follow when taken in conjunction with the above description and accompanying drawings.

What is claimed is:

1. A data receiver of a semiconductor integrated circuit, the data receiver comprising:
    a plurality of receiver units, each of the plurality of receiver units including: a plurality of level detectors, each of the plurality of level detectors configured to detect different signal levels and receive data according to a clock signal having a predetermined phase difference and perform an amplification operation including an equalization function based on feedback data, thereby outputting an amplification signal; and
    an encoder configured to receive the output signals of the plurality of level detectors, wherein level detectors of one receiver unit are configured to receive an amplification signal, as the feedback data, from level detectors of another receiver unit that receives a first clock signal having a phase more advanced than a phase of a second clock signal received in the one receiver unit,
    wherein the plurality of level detectors include:
        a high-level detector configured to amplify the data based on a first reference voltage having been adjusted through the equalization function to output a first amplification signal;
        a mid-level detector configured to amplify the data based on a second reference voltage having been adjusted through the equalization function to output a second amplification signal; and
        a low-level detector configured to amplify the data based on a third reference voltage having been adjusted through the equalization function to output a third amplification signal, and
    wherein the high-level detector includes:
        a cross coupled latch circuit configured to receive the data through a differential input terminal including first and second switching elements to output the first amplification signal; and
        an adjustment circuit configured to control levels of output terminals of the first and second switching elements to set the first reference voltage, and adjust turn-on levels of the first and second switching elements according to the feedback data to adjust an offset of the first reference voltage.

2. The data receiver of claim 1, wherein the adjustment circuit includes:
    a third switching element connected to the first switching element and configured to apply a grounding voltage to a control terminal;
    a fourth switching element connected to the second switching element and configured to apply a power supply voltage to the control terminal;
    a fifth switching element connected to the first switching element and configured to input the feedback data to the control terminal; and
    a sixth switching element connected to the second switching element and configured to input the feedback data to the control terminal.

3. The data receiver of claim 1, wherein the mid-level detector includes:
    a cross coupled latch circuit configured to receive the data through a differential input terminal including first and second switching elements to output the second amplification signal; and
    an adjustment circuit configured to control levels of output terminals of the first and second switching elements to set the second reference voltage, and adjust turn-on levels of the first and second switching elements according to the feedback data to adjust an offset of the second reference voltage.

4. The data receiver of claim 3, wherein the adjustment circuit includes:
    a third switching element connected to the first switching element and configured to apply a grounding voltage to a control terminal;
    a fourth switching element connected to the second switching element and configured to apply the grounding voltage to the control terminal;
    a fifth switching element connected to the first switching element and configured to input the feedback data to the control terminal; and
    a sixth switching element connected to the second switching element and configured to input the feedback data to the control terminal.

5. The data receiver of claim 1, wherein the low-level detector includes:

a cross coupled latch circuit configured to receive the data through a differential input terminal including first and second switching elements to output the third amplification signal; and an adjustment circuit configured to control levels of output terminals of the first and second switching elements to set the third reference voltage, and adjust turn-on levels of the first and second switching elements according to the feedback data to adjust an offset of the third reference voltage.

6. The data receiver of claim 5, wherein the adjustment circuit includes:

a third switching element connected to the first switching element and configured to apply a grounding voltage to a control terminal;

a fourth switching element connected to the second switching element and configured to apply the grounding voltage to the control terminal;

a fifth switching element connected to the first switching element and configured to input the feedback data to the control terminal; and a sixth switching element connected to the second switching element and configured to input the feedback data to the control terminal.

7. The data receiver of claim 2, wherein the data are differential data and wherein the sixth switching element is configured to receive feedback data with a phase identical to a phase of differential data applied to the first switching element, and the fifth switching element is configured to receive feedback data with a phase identical to a phase of differential data applied to the second switching element.

8. The data receiver of claim 4, wherein the data is differential data and wherein the sixth switching element is configured to receive feedback data with a phase identical to a phase of differential data applied to the first switching element, and the fifth switching element is configured to receive feedback data with a phase identical to a phase of differential data applied to the second switching element.

9. The data receiver of claim 6, wherein the data is differential data and wherein the sixth switching element is configured to receive feedback data with a phase identical to a phase of differential data applied to the first switching element, and the fifth switching element is configured to receive feedback data with a phase identical to a phase of differential data applied to the second switching element.

* * * * *